(12) United States Patent
Amerasekera et al.

(10) Patent No.: US 7,456,477 B2
(45) Date of Patent: *Nov. 25, 2008

(54) ELECTROSTATIC DISCHARGE DEVICE AND METHOD

(75) Inventors: E. Ajith Amerasekera, Plano, TX (US); Vikas Gupta, Dallas, TX (US); Stanton P. Ashburn, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1202 days.

This patent is subject to a terminal disclaimer.

(21) Appl. No.: 10/191,902

(22) Filed: Jul. 9, 2002

(65) Prior Publication Data

US 2003/0034527 A1 Feb. 20, 2003

(51) Int. Cl.
*H01L 23/62* (2006.01)

(52) U.S. Cl. .................................. 257/357; 257/355

(58) Field of Classification Search ......... 257/355–363, 257/336, 344, 500, 369–372, 173, E21.632, 257/E29.181; 438/309
See application file for complete search history.

(56) References Cited

U.S. PATENT DOCUMENTS

| | | | | |
|---|---|---|---|---|
| 4,760,433 A | * | 7/1988 | Young et al. | 257/357 |
| 5,021,853 A | * | 6/1991 | Mistry | 257/357 |
| 5,181,091 A | * | 1/1993 | Harrington et al. | 257/355 |
| 5,208,475 A | * | 5/1993 | Mortensen | 257/360 |
| 5,262,344 A | * | 11/1993 | Mistry | 438/200 |
| 5,374,838 A | * | 12/1994 | Sawada et al. | 257/369 |
| 5,416,351 A | * | 5/1995 | Ito et al. | 257/357 |
| 5,559,352 A | * | 9/1996 | Hsue et al. | 257/328 |
| 5,754,380 A | * | 5/1998 | Ker et al. | 361/56 |
| 5,777,368 A | * | 7/1998 | Wu et al. | 257/360 |
| 5,976,921 A | * | 11/1999 | Maeda | 438/202 |
| 6,278,162 B1 | * | 8/2001 | Lien et al. | 257/408 |
| 6,433,392 B1 | * | 8/2002 | Amerasekera et al. | 257/355 |

* cited by examiner

*Primary Examiner*—Hung Vu
(74) *Attorney, Agent, or Firm*—Jacqueline J. Garner; W. James Brady, III; Frederick J. Telecky, Jr.

(57) ABSTRACT

The high current capabilities of a lateral npn transistor for application as a protection device against degradation due to electrostatic discharge (ESD) events are improved by adjusting the electrical resistivity of the material through which the collector current flows from the avalanching pn-junction to the wafer backside contact. As expressed in terms of the second threshold current improvements by a factor of 4 are reported. Two implant sequences are described which apply local masking and standard implant conditions to achieve the improvements without adding to the total number of process steps. The principle of p-well engineering is extended to ESD protection devices employing SCR-type devices.

2 Claims, 7 Drawing Sheets

| # | PURPOSE | DEPTH | DOSE | DESIGNATION |
|---|---|---|---|---|
| 1 | N-WELL | VERY DEEP | HIGH | N-WELL |
| 2 | P-WELL | VERY DEEP | HIGH | P-WELL |
| 3 | SET N-CHAN. Vth | VERY SHALLOW | MEDIUM | $Vtn1$ |
| 4 | PREV. PUNCH THROUGH | SHALLOW | MEDIUM | $Vptn$ |
| 5 | N-CHANNEL STOP | DEEP | MEDIUM | $CSn$ |
| 6 | SET 2nd N-CHAN. Vth | VERY SHALLOW | MEDIUM | $Vtn2$ |
| 7 | SET P-CHAN. Vth | VERY SHALLOW | MEDIUM | $Vtp$ |
| 8 | PREV. PUNCH-THROUGH | SHALLOW | MEDIUM | $Vptp$ |
| 9 | P-CHANNEL STOP | DEEP | MEDIUM | $CSp$ |

ELECTROSTATIC DISCHARGE DEVICE AND METHOD

CROSS-REFERENCE TO RELATED PATENT APPLICATIONS

The following co-pending applications assigned to the assignee of this application discloses related subject matter: U.S. patent application Ser. No. 60/081,119, filed Apr. 08, 1998 (TI-25844).

BACKGROUND OF THE INVENTION

This invention relates to the field of semiconductor integrated circuits and manufacturing, and more specifically to electrostatic discharges (ESD) protection in integrated circuits.

An overview of the field of ESD protection in integrated circuits appears in Amerasekera et al, ESD in Silicon Integrated Circuits (John Wiley &Sons Ltd, 1995) and C. Duvvury et al. "ESD: A Pervasive Reliability Concern for IC Technologies", Proceedings of the IEEE. Vol.81, No.5, May 1993, p.690-702.

ESD phenomena in silicon integrated circuits are growing in importance as the demand for higher operating speed, smaller operating voltages, higher packing density and reduced cost drives a reduction of all device dimensions. This generally implies thinner dielectric layers, higher doping levels with more abrupt doping transitions, and higher electric fields, all factors that contribute to an increased sensitivity to damaging ESD events.

Dual voltage chip architectures are being introduced to offer the flexibility to maintain a higher operating voltage for peripheral input/output circuits while independently optimizing the core transistors. This increases the complexity of ESD protection circuits.

The challenge of cost reduction in this environment of increasing device complexity implies a drive for the use of a minimum number of process steps, a minimum number of photomasks and the application of standardized process conditions to the largest extend possible. There is a problem to improve conventional ESD protection circuits without introducing additional process steps or new process conditions, such as the use of additional ion implant conditions or implant species.

One of the commonly used components in an ESD protection circuit is an NMOS transistor which operates in the mode of a lateral bipolar npn transistor during an ESD event and provides a low impedance current path to ground. FIG. 1 depicts schematically the cross-section of such a lateral npn transistor. An epitaxial p-type silicon layer 2 has been grown on an p-type silicon substrate 1 and a p-well 3 has been formed by localized acceptor ion implantation and annealing. The n-plus collector region 4 and emitter region 5 were formed by shallow ion implants of donors. The surface between the emitter 5 and the collector 4 is covered by a gate oxide layer 6. Layers 7, 8, 9 and 10 provide metallic contacts to the gate, emitter, collector and the wafer backside, respectively.

To explain the present invention, the operation of the lateral npn transistor will first be described with the help of FIG. 2. The emitter, the gate and the wafer backside are connected to ground. A positive voltage spike at the collector, as caused by an ESD event, applies a reverse bias to the collector/base junction (the base is the epitaxial layer plus substrate). When the electric field in the depletion region exceeds the breakdown field, avalanching occurs. The avalanche mechanism forms electron/hole pairs. Electrons flow into the collector and holes flow into the p-type base. This hole current flows from the collector junction through the substrate to the backside contact, generating a positive, i.e. forward, bias, for the emitter/base junction. This emitter forward bias is proportional to the sum of the resistance components in the current path, which are schematically shown as R-PWELL and R-SUB in FIG. 2. Those of the electrons injected from the emitter into the base which reach the collector depletion layer will participate in the avalanche mechanism. The electron concentration will be multiplied in accordance with the electric field dependent avalanche multiplication factor M. The resulting reduction of the device impedance is reflected in a "snap back" in the current-voltage characteristics of the device. As shown in FIG. 3, "snap back", which corresponds to a "turn on" of the bipolar transistor, occurs at the collector voltage Vt1 with an associated collector current It1. The field dependence of the avalanche multiplication factor is responsible for the establishment of a new stable current/voltage equilibrium. At high electron injection levels base conductivity modulation also contributes towards making the device impedance positive again. It should be mentioned that the lateral npn transistor also protects against negative ESD pulses. Referring to FIG. 1, the collector 4 now acts as emitter and diverts the ESD current to the backside substrate contact 10 and to the now reverse biased emitter 5, which now acts as collector.

The current carrying capability of the device is limited by thermal effects in the avalanching collector depletion layer. A number of effects contribute to the onset of second (thermal) breakdown, such as the increase of intrinsic carrier concentration, ni, a reduced carrier mobility, a decrease in thermal conductivity, and a lowering of the potential barrier for tunnel currents. The second breakdown trigger current, shown as It2 in FIG. 3, is very sensitive to the device design, i.e. doping profiles, and is often used as a process monitor. The second breakdown results in junction melting and in an irreversible increase in leakage currents. It must be avoided for normal device operation.

For different ESD applications, the breakdown voltage of this device has to be adjusted. U.S. Pat. No. 5,539,233 described the application of specific ion implantation steps to control the doping profiles of the collector and base regions, thereby selecting the breakdown voltage of the device.

SUMMARY OF THE INVENTION

This invention provides methods to improve the high current capability of an NMOS transistor operating in a lateral npn bipolar transistor mode during an ESD event: the second breakdown trigger current is raised by adjusting the resistivity of the material between the avalanching collector/base pn-junction and the substrate contact on the backside of the silicon chip. Local ion implant steps are applied to achieve the improvements. Two preferred embodiments apply implant steps from a standard process flow and do not require an increase of the total number of process steps. The principle of the invention is also applicable to SCR-type ESD protection circuits.

DESCRIPTION OF THE PREFERRED EMBODIMENTS

Figure 2:
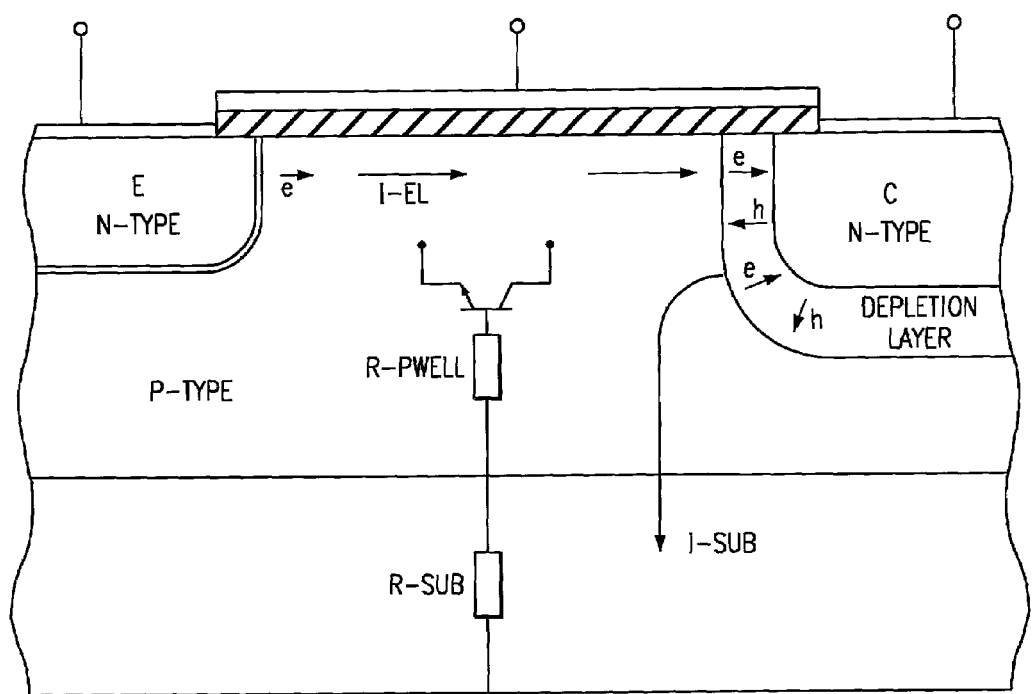
FIG. 2 schematically depicts internal physical components and currents during the operation of a lateral npn transistor according to prior art.
Figure 3:
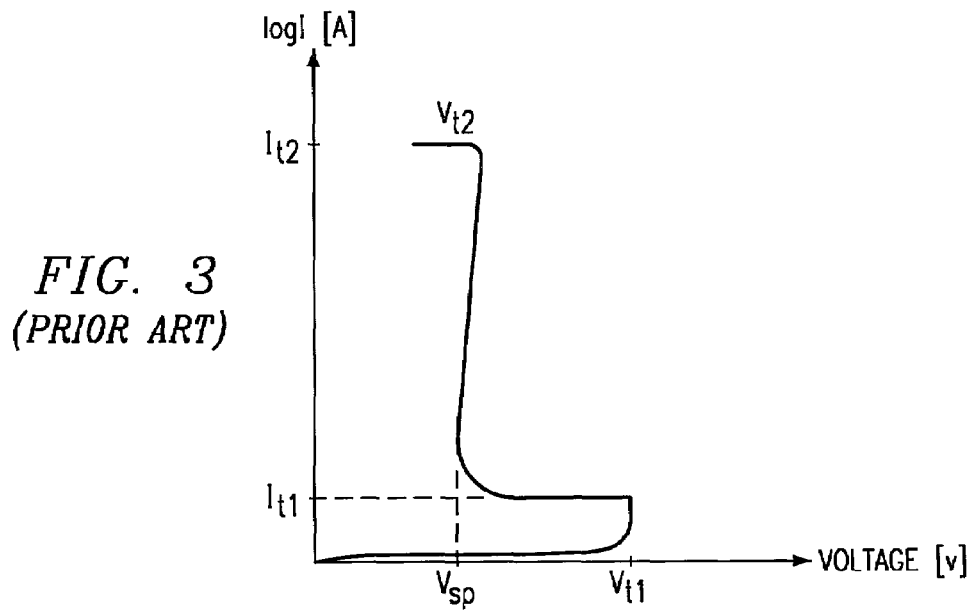
FIG. 3 schematically depicts the I-V characteristics of a lateral npn transistor.
Figure 4:
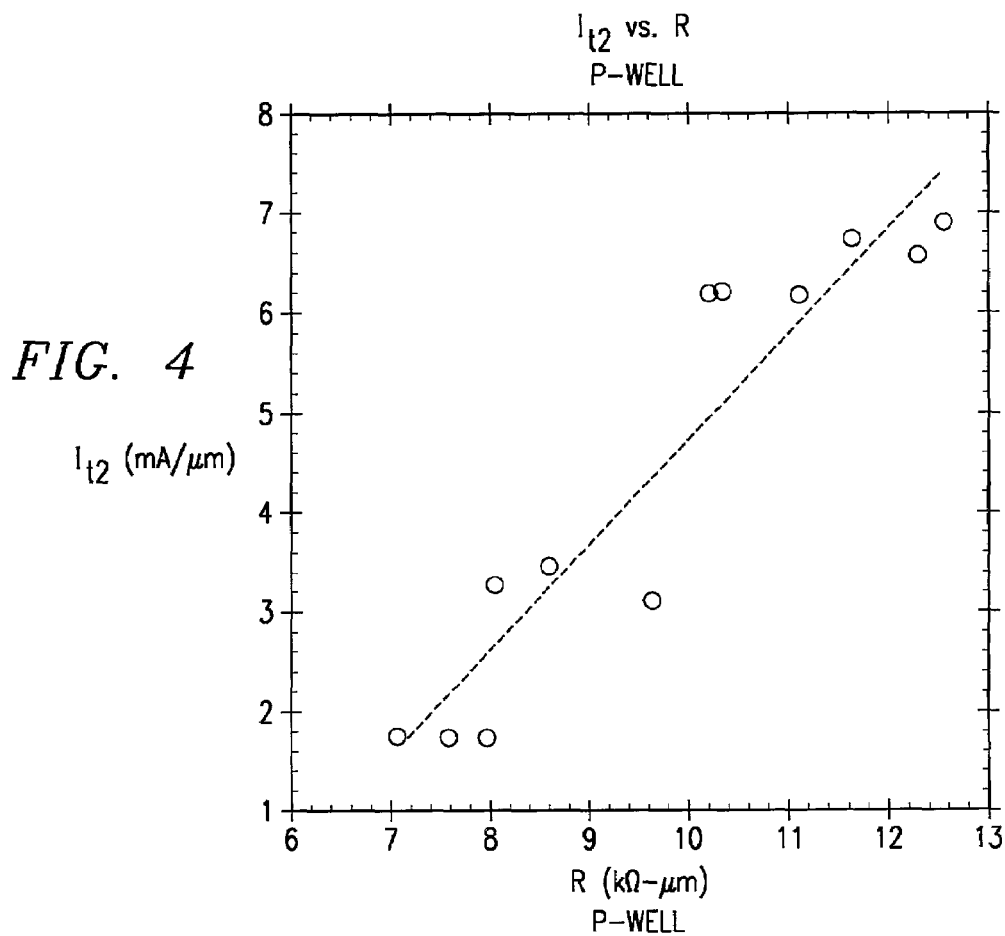
FIG. 4 presents the second breakdown threshold current vs. substrate resistivity.

It was described with the help of FIG. 2 how the hole current, originating in the avalanching collector/base junction and flowing to the wafer backside contact, causes a voltage drop across resistors R-pwell and R-sub, which forward biases the emitter/base junction. Increasing the resistance of these resistors leads to an earlier turn-on of the emitter and to a reduction of the current contribution of the avalanche mechanism. This is reflected in an increase of the second breakdown threshold current It2. Experimental results of the performance improvements that have been achieved are presented in FIG. 4, which shows the measured dependence of the normalized It2 as a function of the normalized p-well resistance. A resistance increase by a factor of 1.5 led to an It2 improvement by a factor of 4.5.

Figures 5, 6:
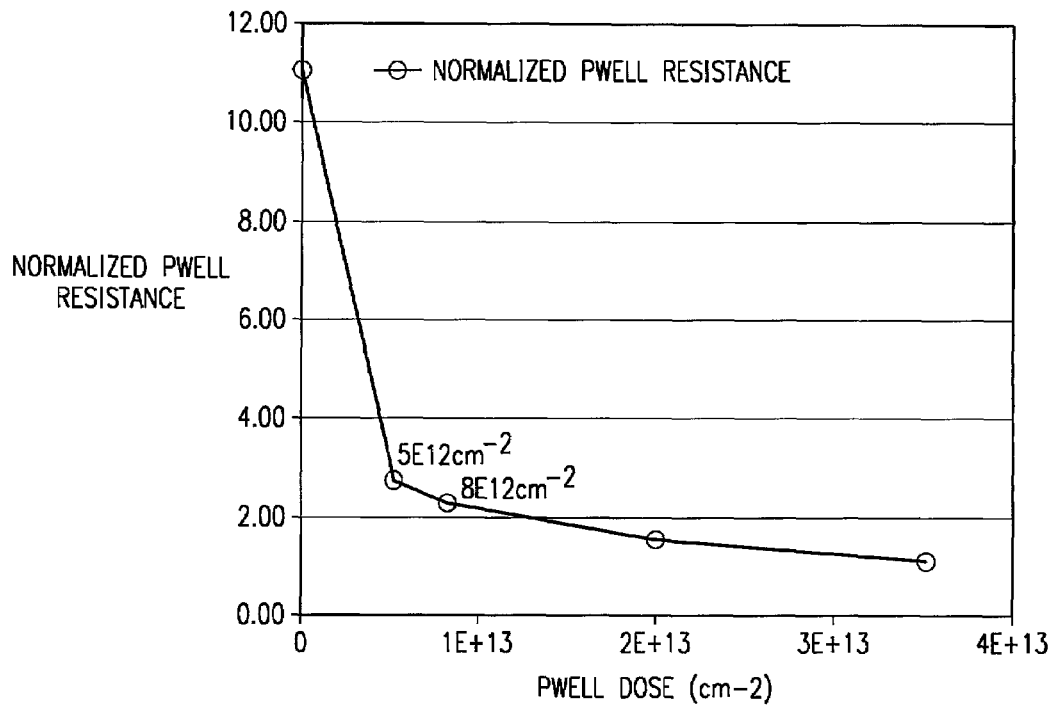
FIG. 5 presents the normalized P-WELL resistance as a function of the implant dose.
FIG. 6 presents a list of implant steps used to fabricate CMOS ICs.

The data presented in FIG. 5 show the measured dependence of the normalized p-well resistance on the dose of the p-well ion-implantation. The p-well resistance can be increased by more than a factor of 4 by selecting a lower implant dose.

For cost containment reasons, it is desirable to obtain the optimum resistance range without the introduction of new or additional process steps. FIG. 6 presents a schematic list of ion implant steps used commonly in the fabrication of CMOS ICs with transistors for two operating voltages. Listed are the purpose, the schematic depth and dose characteristics, and the designations of these implants and depth in FIGS. 7-9. In particular, the N-well implant creates the N-well, the P-well implant creates the P-well, the Vtn1 implant sets the threshold voltage Vtn for NMOS devices, the Vptn implant prevents punch through for NMOS devices, the CSn implant is the channel stop for parasitic NMOS, the Vtn2 implant further adjusts the threshold voltage for low voltage NMOS devices, the Vtp implant sets the threshold voltage Vtp for PMOS devices, the Vptp implant prevents punch through for PMOS devices, and the CSp implant is the channel stop for parasitic PMOS.

Figure 1:
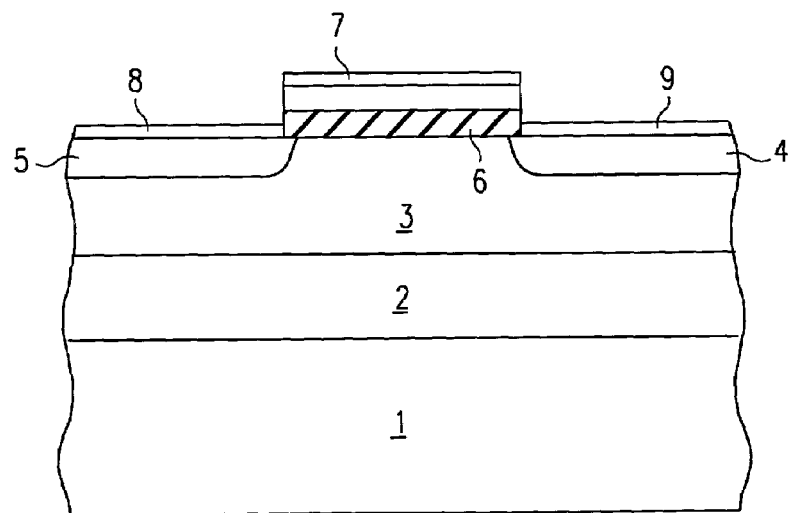
FIG. 1 schematically depicts the cross-section of an NMOS lateral bipolar npn transistor according to prior art.
Figure 7:
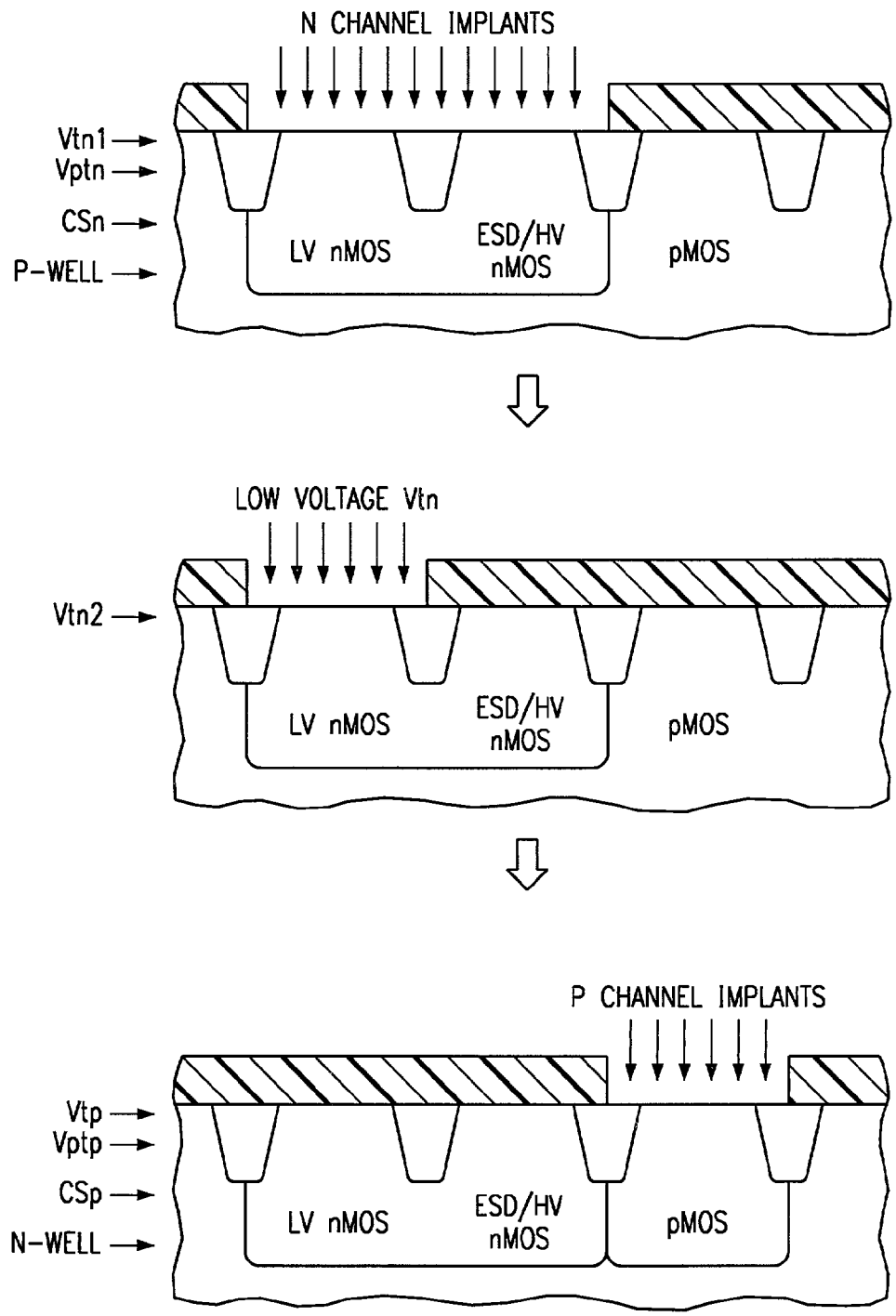
FIG. 7 schematically depicts the standard process flow to manufacture lateral npn transistors.

A standard implant process flow for the fabrication of a CMOS structure with ESD devices is schematically depicted in FIG. 7 which labels the regions of a silicon substrate (plus epilayer) for a low voltage NMOS device as "LV nMOS", for a high voltage NMOS and ESD devices as "ESD/HV nMOS", and for a PMOS device as "pMOS". The implants are as follows. Mask off the n-well area, then form the p-well with implant P-well of boron at 500 KeV and a dose about $3.5 \times 10^{13}/cm^2$. Then perform the n-channel implants Vtn1 (boron at 20 KeV and dose $3 \times 10^{12}/cm^2$), Vptn (boron at 70 KeV and dose $7 \times 10^{12}/cm^2$), and CSn (boron at 160 KeV and dose $4 \times 10^{12}/cm^2$) while the n-well area remains masked off. For a dual-voltage design implant Vtn2 (more boron) into the low-voltage area sets the second threshold voltage Vtn2. The hole current, Isub, of an avalanching ESD device flows through material doped by implants P-well, Vtn1, Vptn, and CSn, through epitaxial layer 2 (FIG. 1), and finally through the substrate. A typical value for the second breakdown threshold current as observed for such a structure is It2=5 mA/micrometer.

Figure 8:
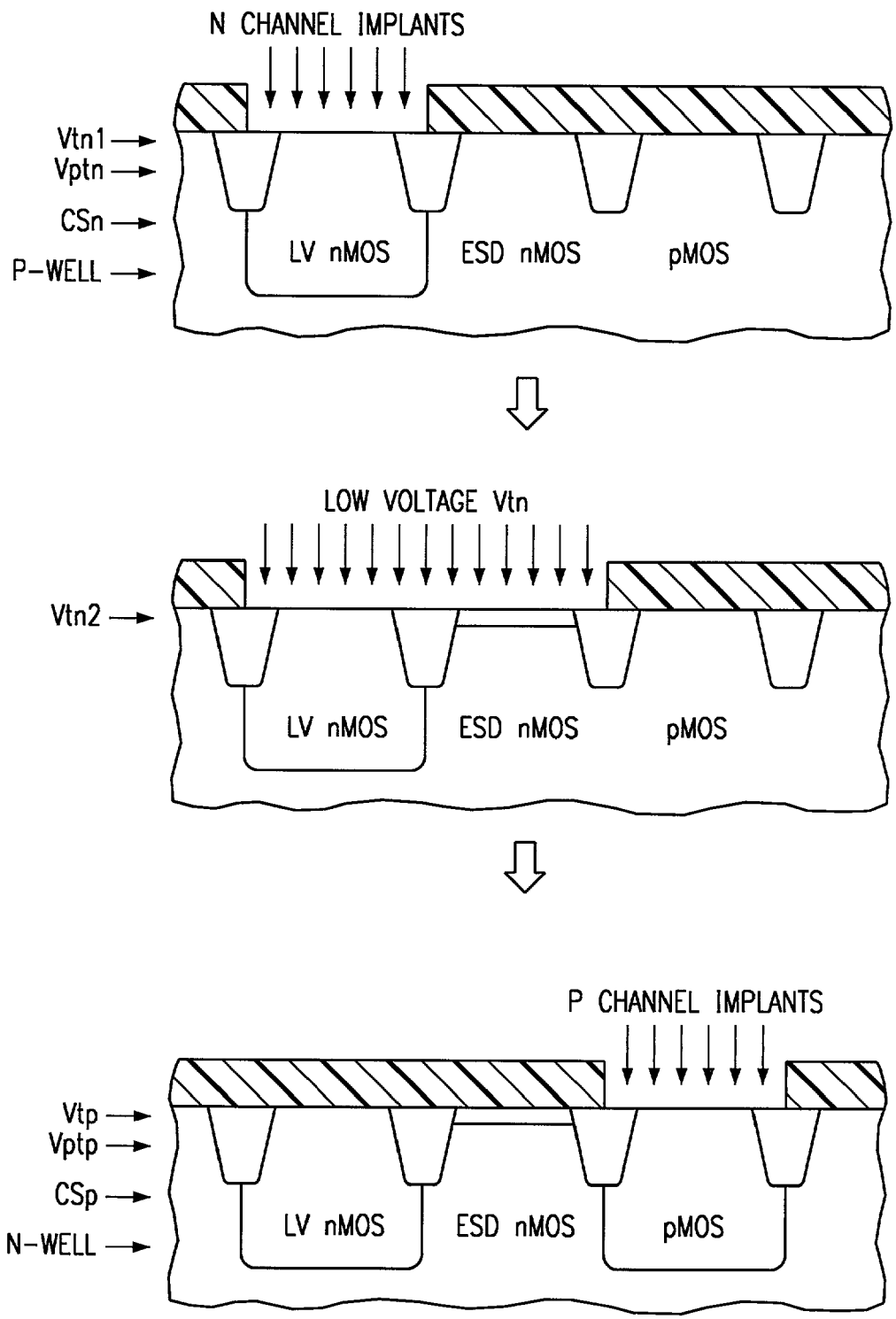
FIG. 8 schematically presents one preferred embodiment.

Besides the approach to use local implants to control the p-well resistance and to select the implant conditions according to the data of FIG. 5, the preferred embodiment methods increase the value of "R-pwell" without increasing the number of process steps. In particular, FIG. 8 shows the first preferred embodiment masking off the ESD region ("ESD nMOS" in FIG. 8) during the p-well and the n-channel implants, i.e. implants P-well, Vtn1, Vptn, and CSn, although regions for high voltage NMOS devices still receive these implants. The ESD protection region is only exposed to the shallow Vtn2 implant. This implant is used to set the doping in the area where the collector and emitter of the lateral npn transistor are formed. Subsequent p-channel implant steps remain unaltered, and the ESD region is masked off. The doping level of the material for the substrate current path is now determined by the doping level of the p-type epitaxial layer, into which the structure is built, and by the doping level of the substrate.

Figure 9:
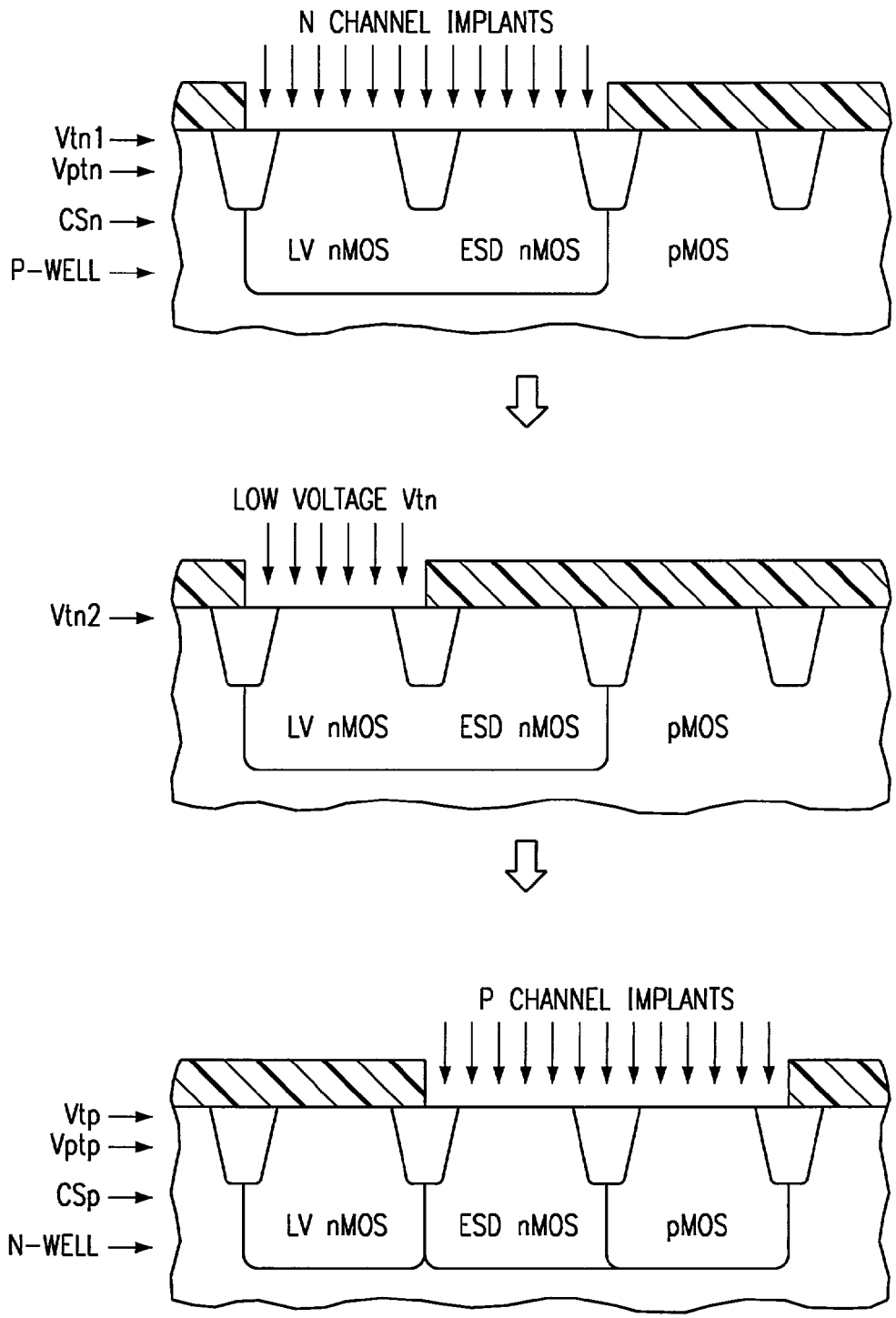
FIG. 9 schematically presents another preferred embodiment.

FIG. 9 illustrates a second preferred embodiment method which counter-dopes or compensates as a means to increase the resistivity of the substrate current path. The ESD protection region treated as in FIG. 7 and is exposed to the P-well implant, and to the n-channel implants Vtn1, Vptn, and CSn, and the area is masked off during the Vtn2 implant. But the ESD protection region is also exposed to the N-well implant and the p-channel implants Vtp, Vptp, and CSp. The implants could be phosphorus at 825 KeV and a dose of $4 \times 10^{13}/cm^2$, at 50 KeV and dose $3 \times 10^{12}/cm^2$, at 150 KeV and dose $4 \times 10^{12}/cm^2$, and at 340 KeV and dose $2 \times 10^{12}/cm^2$, respectively. This counterdoping decreases the net carrier concentration and thereby increases the resistance.

An alternative preferred embodiment well formation method first implants a low dose of boron without masking to form blanket p-wells, then masks off the ESD region and core n-well regions and implants a high dose of boron to form core p-wells, and lastly masks off the ESD region and core p-well regions and implants a high dose of phosphorus to form the core n-wells; this is a counterdoping to form the n-wells and saves a mask.

Figure 10A:
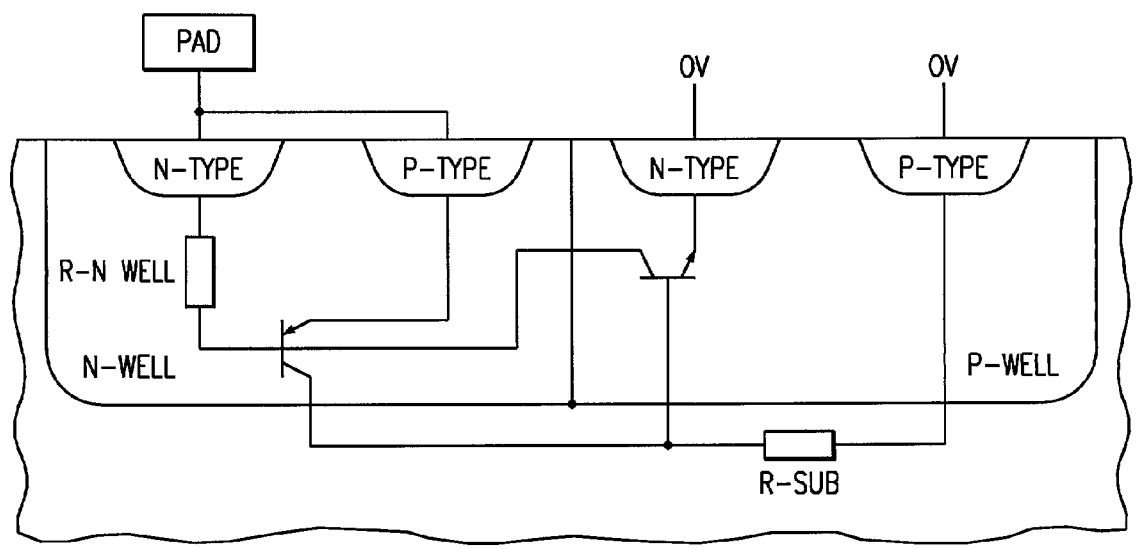
FIGS. 10A-10B schematically show an SCR-type protection circuit preferred embodiment.
Figure 10B:
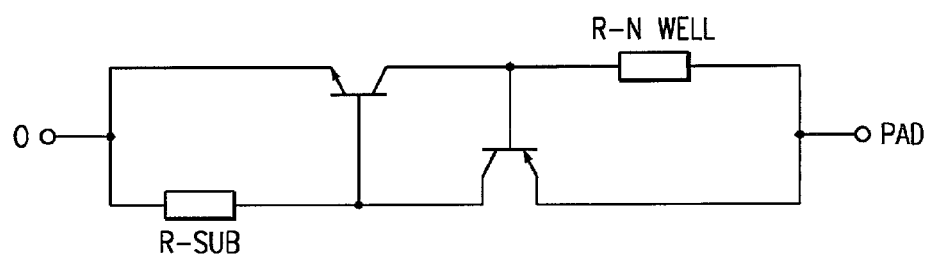

Further, the preferred embodiments' use of control of the p-well resistance to enhance the ESD protection device characteristics, also applies to SCR-type protection devices. FIGS. 10A and 10B schematically depict the cross-section of a lateral PNPN structure and the equivalent circuit, respectively. The trigger characteristics are impacted by the internal resistances R-SUB and R-NWELL. As can be understood from an inspection of FIG. 10B, an increase of their values leads to a reduction of the forward breakover voltage of the SCR-type device. Modifications of the foregoing preferred embodiments which retain the feature of a lower net carrier concentration in the ESD regions compared to the NMOS regions by either less implantation or counterdoping include variations in the implant doses and energies and order of steps. Thus the doping profile through the ESD region from the surface down past the channel stop implant is less than the corresponding doping profile through the NMOS channel region for the preferred embodiment of FIG. 8. And the doping profile through the ESD region for the preferred embodiment of FIG. 9 is essentially the difference (net) of the profiles for the NMOS and PMOS through their respective channel regions.

What is claimed is:

1. An integrated circuit, comprising:
   (a) a silicon substrate;
   (b) first and second p-well regions with first and second doping profiles in a direction perpendicular to a surface of said substrate, said first p-well region containing an NMOS device, said second p-well region containing an ESD protection device, wherein said second doping profile is less than said first doping profile near said surface; and
   (c) an n-well region, said n-well region containing a PMOS device.

2. An integrated circuit, comprising:
   (a) a silicon substrate;
   (b) first and second p-well regions with first and second doping profiles in a direction perpendicular to a surface of said substrate, said first p-well region containing an NMOS device, said second p-well region containing an ESD protection device; and
   (c) an n-well region, said n-well region with a third doping profile in said direction, said n-well containing a PMOS device, wherein said second doping profile is the difference of said first doping profile and said third doping profile near said surface.

* * * * *